«12» United States Patent
Guettaf

(10) Patent No.: US 7,558,722 B2
(45) Date of Patent: Jul. 7, 2009

(54) DEBUG METHOD FOR MISMATCHES OCCURRING DURING THE SIMULATION OF SCAN PATTERNS

(75) Inventor: Amar Guettaf, Sunnyvale, CA (US)

(73) Assignee: Broadcom Corporation, Irvine, CA (US)

( * ) Notice: Subject to any disclaimer, the term of this patent is extended or adjusted under 35 U.S.C. 154(b) by 1452 days.

(21) Appl. No.: 10/299,129

(22) Filed: Nov. 19, 2002

(65) Prior Publication Data

US 2004/0098239 A1    May 20, 2004

(51) Int. Cl.
 G06F 17/50  (2006.01)
 G06F 11/00  (2006.01)
 G01R 31/28  (2006.01)
(52) U.S. Cl. .................. 703/15; 714/30; 714/729; 714/731
(58) Field of Classification Search ............ 714/729, 714/731, 30; 324/121; 703/15
 See application file for complete search history.

(56) References Cited

U.S. PATENT DOCUMENTS 6,694,454 B1 * 2/2004 Stanley .................. 714/30

OTHER PUBLICATIONS

Ruifeng Guo and Venkataraman, S.; A Technique For Fault Diagnosis Of Defects In Scan Chains; Oct. 30-Nov. 1, 2001; Proceedings International Test Conference, 2001; pp. 268-277.*
Yuejian Wu; Diagnosis Of Scan Chain Failures; Nov. 2-4, 1998; Proceedings 1998 IEEE International Symposium on Defect and Fault Tolerance in VLSI Systems; pp. 217-222.*
TetraMAX® ATPG User Guide; Synopsys; Version 2002.05, May 2002; pp. 1-6, 10-27, 10-36, 15-1, 15-4.*
R. Guo and S. Venkataranman, A new technique for scan chain failure diagnosis, Nov. 3-7, 2002, Proc. Int. Symp. Testing and Failure Analysis, pp. 723-732.*
TetraMAX(r) Workshop; Student Guide; Synopsys; 1999; p. 3-37.*
* cited by examiner Primary Examiner—Paul L Rodriguez
Assistant Examiner—J. Ochoa
(74) Attorney, Agent, or Firm—McAndrews, Held & Malloy, Ltd.

(57) ABSTRACT

A method and system are disclosed for testing for double shift errors in at least one scan chain of flip-flops during a simulation of the design of a digital integrated circuit chip. At the start of the simulation, outputs of each flip-flop in the scan chain are initialized to a same known symbol (e.g., 'X'). The flip-flops in the scan chain are clocked to shift binary digital symbols (zeros and ones) into the first flip-flop and through the successive flip-flops in the scan chain. During the shifting and clocking process, successive, contiguous pairs of flip-flop outputs are compared, one pair after each clock cycle. A double shift error is declared between the first flip-flop in the pair and the second flip-flop in the pair if the output symbols of the pair are the same.

13 Claims, 4 Drawing Sheets

DEBUG METHOD FOR MISMATCHES OCCURRING DURING THE SIMULATION OF SCAN PATTERNS

RELATED APPLICATIONS

[Not Applicable]

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

Digital integrated circuit chips are composed of many millions of gates that make up various functional components on a chip such as flip-flops, multiplexors, logic circuits, etc. A given chip design may have thousands of flip-flops scattered throughout the chip.

In order to effectively and efficiently test a given chip, certain test features are typically incorporated into the chip design for testing purposes. Before a chip is actually taped out and manufactured, the chip design is first simulated in software using various simulation tools such as, for example, a Verilog Test Bench. By simulating the design of the chip, the design features of the chip may be thoroughly tested before the expense and time of actually manufacturing the chip is incurred.

Pattern verification is a critical phase in testing of chips. A scan pattern is a digital string of binary ones and zeros that may be shifted through a scan chain of flip-flops in the chip design. Every scan pattern cycle is composed of two phases. The first phase is the load_unload phase where new data is shifted into the scan chains of flip-flops. The second phase is the capture phase where the data is captured into the flip-flops by applying a clock pulse.

Typically, the flip-flops in a digital integrated circuit design are designed such that they have normal data inputs and outputs (D and Q) and test inputs such as TI (test data input) and TE (test enable input). During simulation, the flip-flops may be placed in the test mode by enabling the TE input. Data may then be clocked into the flip-flops through the TI input instead of the normal D data input. During testing, the flip-flops of the chip are chained together to form multiple scan chains. The output Q of a given flip-flop is connected to the input TI of a next flip-flop. Each scan chain may comprise, typically, 5000 to 10,000 flip-flops.

The length of the load_unload phase is equal to the length of the longest scan chain of flip-flops. In multimillion gate designs, the longest chain may have thousands of flip-flops. Most of the time, simulating the scan patterns through the scan chains is spent shifting the data into and out of the scan chains. To ensure proper behavior of the scan chains, the first test applied to the chip design is Chain Test which consists of shifting in and out a predetermined bit pattern (e.g. 0011).

FIG. 1. illustrates the timing operation of a flip-flop within a chip design. In order for a flip-flop to capture data at its output Q when presented at its input D (or TI during test mode), the data must be present at the input D (or TI) for a setup time 10 before the clock edge 20 comes along to clock the data into the flip-flop. Also, the data must be held steady at the input D (or TI) for a hold time 30 to ensure the data is properly clocked into the flip-flop and appears at the output Q. The setup time 10 may typically be around 200 picoseconds and the hold time 30 may typically be around 100 picoseconds. Together, the setup time 10 and the hold time 30 make up the setup-and-hold window 40. If the data at input D (or TI) of a flip-flop changes during the setup-and-hold window 40, then the resultant output at Q cannot be guaranteed.

FIG. 2 illustrates an example where a particular type of error may occur in a scan chain. The error is called a double shift error and is caused by an excessive delay between the clock inputs of two successive, contiguous flip-flops within a scan chain. If the clock signal for flip-flop 3 (FF3) is delayed too much compared to the clock signal for flip-flop 2 (FF2), then the data shifted into FF2 will be captured in FF3 in the same clock cycle (see waveform Q(3) wrong). Q(2) becomes a '1' before the previous Q(2)=0 state can get clocked into FF3 (i.e., Q3 becomes '1'instead of '0' as it should if the timing were correct). Such behavior translates into scan pattern failures.

If the skew between the two clock destinations (FF2 and FF3) is within the setup-and-hold window 40, then any failure will appear as a timing violation within the simulation land a symbol X will be captured for the faulty flip-flop (FF3). However, if the skew is wider than the setup-and-hold window, then the failure constitutes a double shift error between the two flip-flops.

A timing violation error message in the simulation contains enough information to identify the faulty flip-flop but the double shift error is more challenging to debug. In other words, isolating the double shift error to two flip-flops can be difficult and time consuming. The mismatch caused by the double shift error first appears at the output of the scan chain after N cycles where N is the number of flip-flops in the longest scan chain. Since the data is shifted through thousands of flip-flops, there is no indication of where the double shift error may have occurred. In order to find the source of the mismatch (i.e. the two flip-flops), it is often necessary to look at thousands of clock and data waveforms across thousands of clock cycles. This is very time consuming and prone to error.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A method is provided for testing at least one scan chain of flip-flops in a simulation of a digital integrated circuit chip for double shift errors. Outputs of each flip-flop in the scan chain are initialized to a same known unique symbol (e.g., 'X'). The flip-flops in the scan chain are clocked to shift a binary digital symbol (a '0' or a '1') to an output of a first flip-flop in the scan chain and to shift the symbols of each output of the other flip-flops in the scan chain to the outputs of each corresponding next flip-flop in the scan chain. The output symbol of the first-flip flop is compared to the output symbol of the next contiguous flip-flop (i.e., second flip-flop in the scan chain). A double shift error is declared between the first flip-flop and the second flip-flop if the output symbols of the first flip-flop and the second flip-flop are the same. More precisely, if the output of the second flip-flop is not 'X', then a double shift error is declared. The process is repeated in order to test all successive, contiguous pairs of flip-flops in the scan chain for double shift errors.

A system is provided to test at least one scan chain of flip-flops in a simulation of a digital integrated circuit chip. The system comprises a simulation hardware test bench and at least one software simulation module residing and operating within the simulation hardware test bench to test at least one scan chain of flip-flops for double shift errors and to isolate any of the double shift errors down to no more than two contiguous flip-flops in the scan chain.

These and other advantages and novel features of the present invention, as well as details of an illustrated embodiment thereof, will be more fully understood from the following description and drawings.

DETAILED DESCRIPTION OF THE INVENTION

Aspects of the present invention provide a method to test for and identify double shift errors between any two consecutive flip-flops in a scan chain during simulation of the design of a digital integrated circuit chip.

Figure 1:
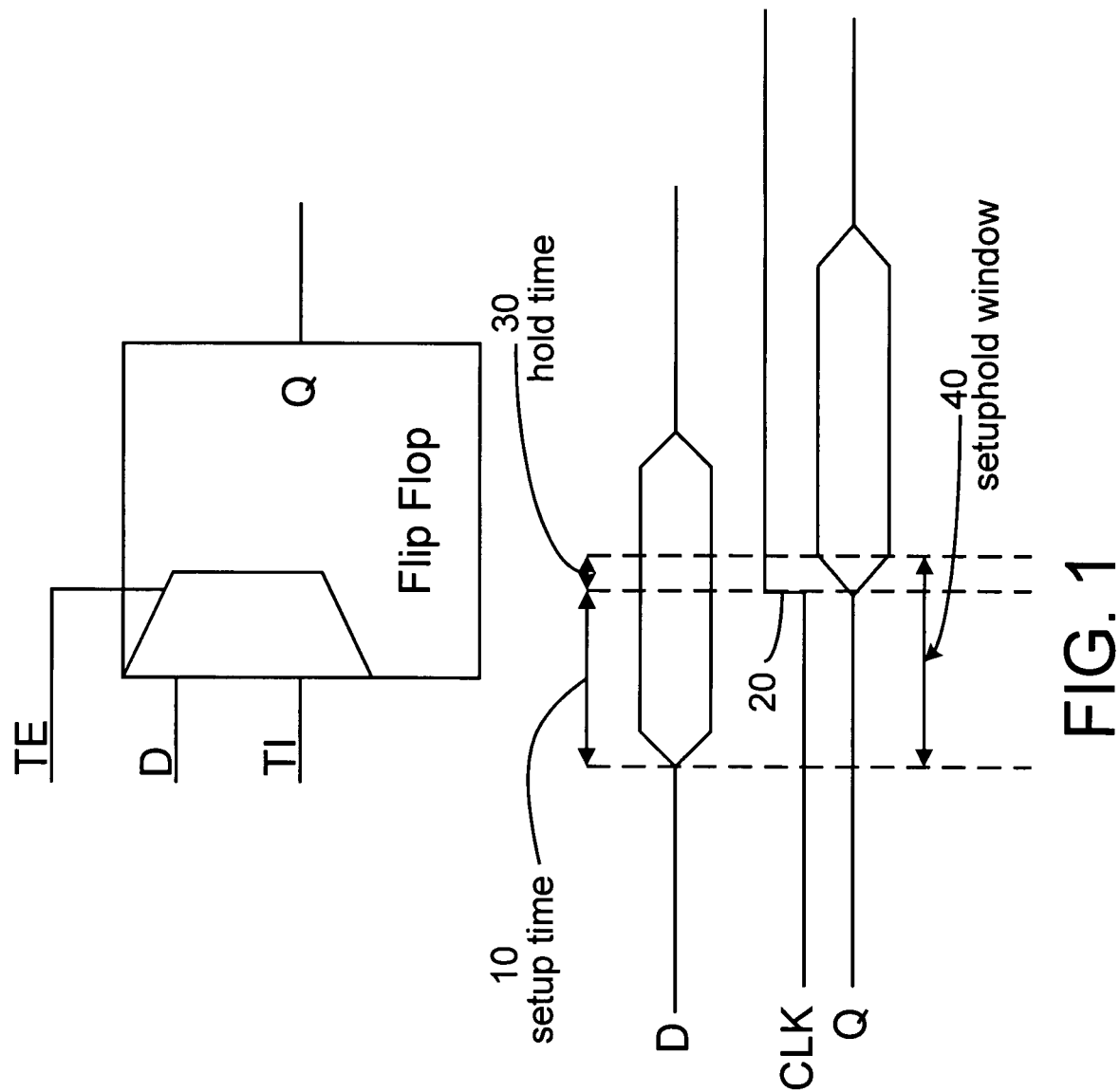
FIG. 1 is a schematic diagram of an exemplary flip-flop and a timing diagram in accordance with an embodiment of the present invention.
Figure 2:
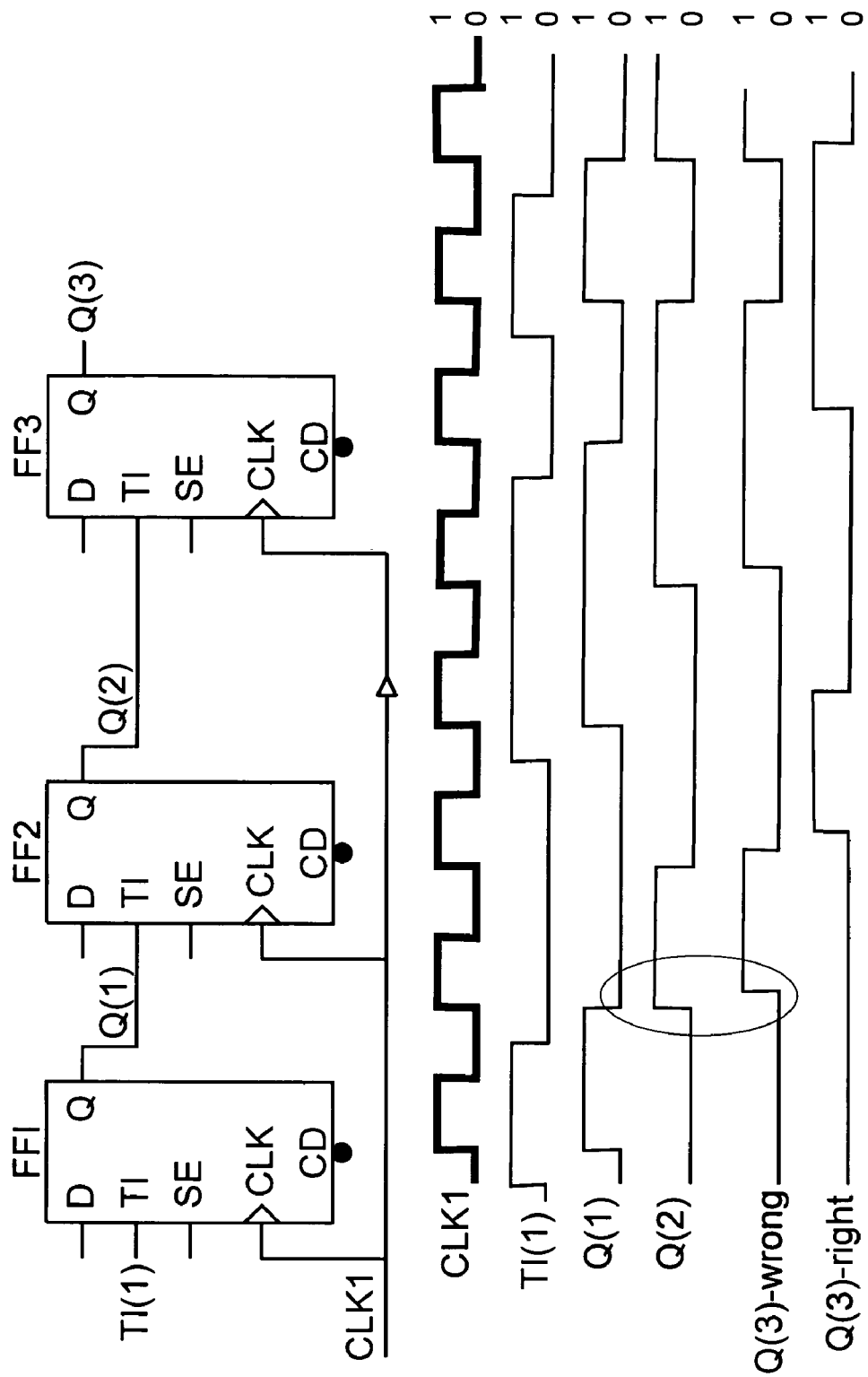
FIG. 2 is a schematic diagram of a scan chain of flip-flops in a test mode configuration and an associated timing diagram in accordance with an embodiment of the present invention.
Figure 3:
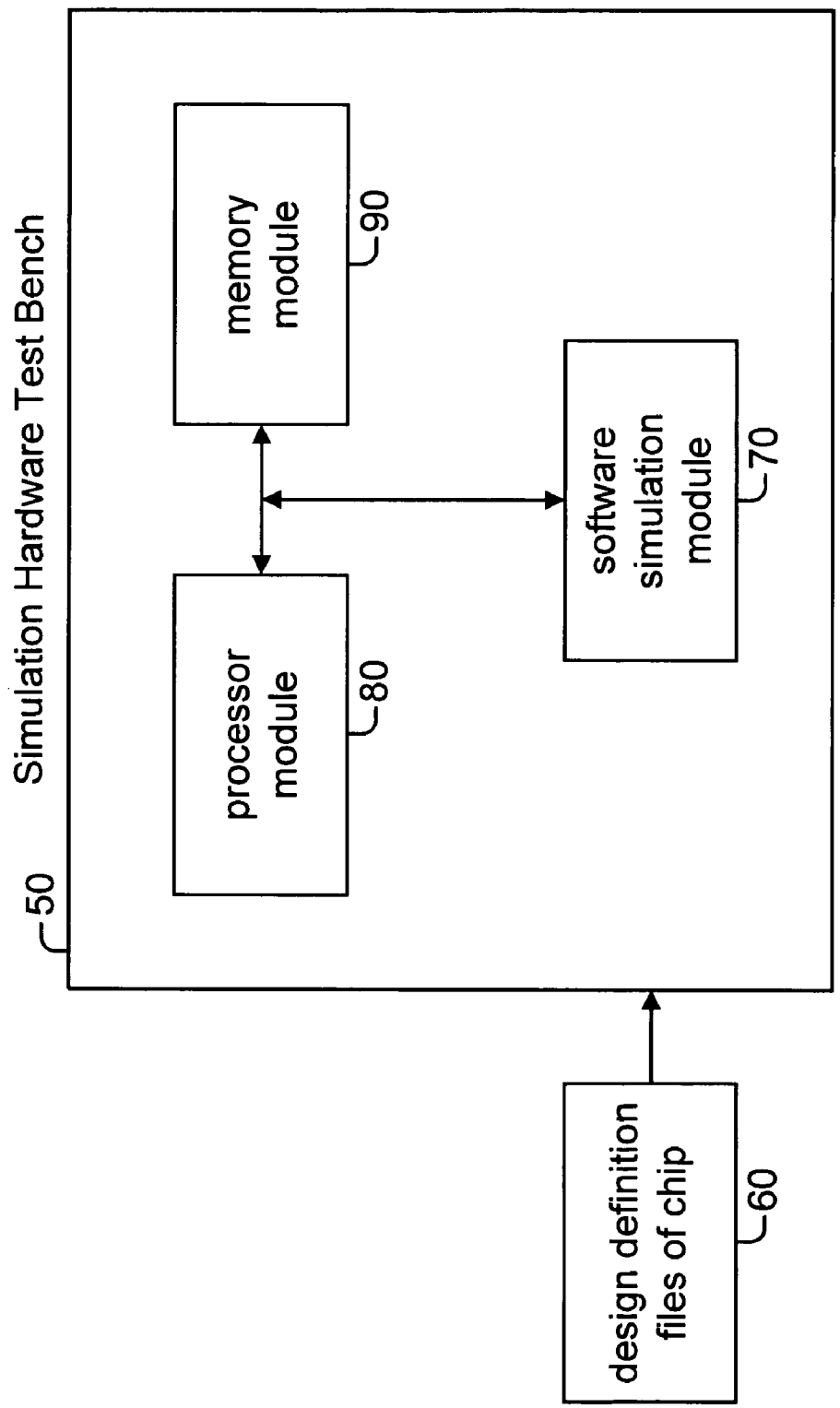
FIG. 3 is a schematic block diagram of a system to test for double shift errors in a scan chain of flip-flops in accordance with an embodiment of the present invention.

Referring to FIG. 3, in an embodiment of the present invention, a simulation hardware test bench 50 is used to test the design of a digital integrated circuit chip. The simulation hardware test bench 50 may comprise at least one processor module 80, at least one memory module 90, and at least one software simulation module 70. A set of design definition files 60 of the chip is loaded into the simulation hardware test bench 50 and is operated on by at least one software simulation module 70 using at least one processor module 80 and at least one memory module 90. In an embodiment of the present invention, the set of design definition files 60 comprises a set of computer files that completely defines the design of the chip including all flip-flops and timing between the flip-flops.

Figure 4:
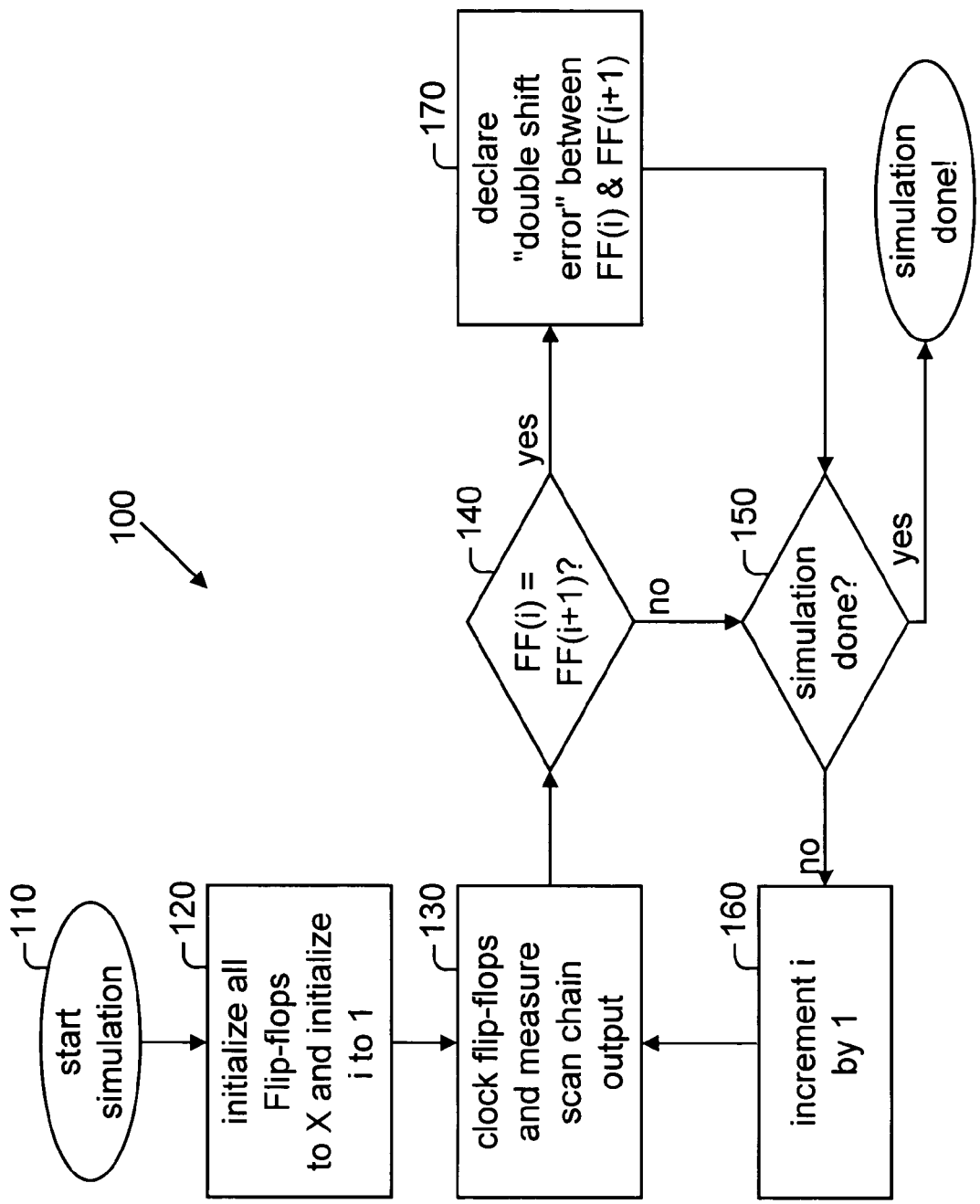
FIG. 4 is a flowchart of a method to test for double shift errors in a scan chain of flip-flops using the system of FIG. 3 in accordance with an embodiment of the present invention.

Referring to FIG. 4, in an embodiment of the present invention, in step 110 of method 100, the simulation of the scan chains is started after the set of design definition files of the chip 60 has been loaded into the simulation. In step 120, all flip-flops in the scan chains to be tested are initialized to 'X' and a counting index, i, is initialized to '1'. In an embodiment of the present invention, the simulation hardware test bench 50 is a Verilog test bench with the software simulation module 70 having the ability to test 32-channels of scan chains at once with each scan chain comprising several thousand flip-flops chained together in series.

In step 130, all the flip-flops in the scan chains are clocked once, with a digital binary symbol ('0' or '1') being clocked into the first flip-flop in every scan chain. In step 140, flip-flop(i), the first flip-flop in each scan chain, is compared to flip-flop (i+1), the second flip-flop in each scan chain since i=1. If the output symbols for Q(i) and Q(i+1) are equal to each other, then in step 170, a double shift error is declared between flip-flops (i) and (i+1) in the simulation. The double shift error is recorded within the simulation, isolated to flip-flop(i) and flip-flop(i+1). If the output symbols Q(i) and Q(i+1) are different from each other (i.e. Q(i+1) is 'X'), then no double shift error has occurred. Excessive delays between the clocks of any two flip-flops may be as much as 2 to 3 nanoseconds due to a design flaw. Typically the setup-and-hold window is around 300 picoseconds and the delay between clock signals of two consecutive flip-flops in a scan chain is less than the setup-and-hold window.

The simulation is checked, in step 150, to see if all pairs of flip-flops in the scan chains have been tested (simulation done?). If not, then in step 160, i is incremented by 1 and the flip-flops are all clocked once again in step 130. In other words, another binary digital symbol is clocked into the first flip-flops in the scan chains and the output symbols for each flip-flop are shifted to the next corresponding contiguous flip-flop in the scan chains. The process repeats to check the next pair of flip-flops (the second flip-flop and the third flip-flop). The process continues until all pairs of flip-flops in all scan chains have been tested for double shift errors. The entire process may take as much as a full day of testing for a typical chip but eliminates, however, the need to look at thousands of clock and data waveforms across thousands of clock cycles to isolate a double shift error between two particular flip-flops which is much more time consuming and prone to error.

As a result, if there is an excessive delay between the clock inputs of any consecutive pair of flip-flops, the method 100 will detect the resultant double shift error and the simulation will identify the exact pair of flip-flops where the design is flawed. A double shift error between two flip-flops constitutes a design error in the chip design.

In addition, the outputs of the scan chains may also be monitored and compared to the expected outputs corresponding to the input symbols.

In summary, aspects of the present invention provide for efficiently testing at least one scan chain of flip-flops, in a simulation of a digital integrated circuit chip, for double shift errors and isolating any double shift error to a specific pair of flip-flops.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. A method for detecting double shift errors in at least one scan chain of flip-flops in a simulation of a digital integrated circuit chip, said method comprising:

initializing the output of each flip-flop in said at least one scan chain to a unique symbol;

clocking said each flip-flop with a common clock signal, said common clock signal providing a clock pulse used to shift a binary digital symbol from an input of a first flip-flop to an output of said first flip-flop, said clock pulse used to shift said unique symbol from said output of said first flip-flop to an output of a second flip-flop, wherein said binary digital symbol is not equivalent to said unique symbol, and said first flip-flop and said second flip-flop comprise a pair of contiguous flip-flops in said at least one scan chain;

comparing said output symbol of said first flip-flop to said output symbol of said second flip-flop within said at least one scan chain after said clocking by said clock pulse has occurred; and declaring a double shift error between said first flip-flop and said second flip-flop if said output symbol of said second flip-flop is equivalent to said output symbol of said first flip-flop after said clocking.

2. The method of claim 1 wherein said clocking, said comparing, and said declaring is performed for every said pair of contiguous flip-flops within said at least one scan chain.

3. The method of claim 1 wherein said binary digital symbol comprises a zero.

4. The method of claim 1 wherein said binary digital symbols comprises a one.

5. The method of claim 1 wherein said double shift error occurs as a result of a relative delay of said common clock signal between clock inputs of said first flip-flop and said second flip-flop, said relative delay greater than a setup-and-hold window time of said first flip-flop.

6. The method of claim 1 wherein said declaring comprises recording said double shift error during said simulation.

7. The method of claim 1 further comprising loading up a design definition file of said chip into a simulation hardware test bench to perform said simulation.

8. A system to test for double shift errors in at least one scan chain of flip-flops in a simulation of a digital integrated circuit chip, said system comprising:

a simulation hardware test bench comprising at least one processor module and at least one memory module;

at least one software simulation module residing and operating within said simulation hardware test bench to test said at least one scan chain of flip-flops for said double shift errors and to isolate any one of said double shift errors down to one pair of flip-flops in said at least one scan chain, wherein a clock signal is used to serially clock a first value through a first flip-flop in said at least one scan chain, said at least one software simulation module initializing all outputs of said flip-flops to a second value, said double shift errors occurring when an output value of said first flip-flop is the same as an output value of said second flip-flop after clocking said first flip-flop and said second flip-flop with said clock signal, said double shift errors occurring because of a relative delay of said clock signal between clock inputs of said first flip-flop and said second flip-flop, said relative delay greater than a setup-and-hold window time of said first flip-flop.

9. The system of claim 8 wherein said simulation hardware test bench comprises a Verilog test bench.

10. The system of claim 8 wherein said simulation hardware test bench utilizes at least one design definition file of said chip.

11. The system of claim 8 wherein said system records said double shift errors.

12. A system to test for double shift errors in at least one scan chain of flip-flops in a simulation of a digital integrated circuit chip, said system comprising:

a simulation hardware test bench comprising:

at least one processor module;

at least one memory module; and at least one software simulation module for facilitating said test for double shift errors and for isolating any one of said double shift errors down to one pair of flip-flops in said at least one scan chain, said at least one software simulation module initializing all outputs of said flip-flops to a first value, wherein a clock signal is subsequently used to clock a second value through a first flip-flop in said at least one scan chain, said first value different from said second value, a double shift error of said double shift errors occurring when an output symbol of said first flip-flop is equivalent to an output symbol of said second flip-flop due to clocking said first flip-flop and said second flip-flop with a clock pulse provided by said clock signal, said double shift errors resulting from a relative delay of said clock signal between clock inputs of said first flip-flop and said second flip-flop, said relative delay greater than a setup-and-hold window time of said first flip-flop, said at least one processor module communicating with and interoperable with said at least one memory module and said at least one software simulation module.

13. The system of claim 12 wherein said second value is a binary digital value.

* * * * *